United States Patent
Chrysostomides et al.

(10) Patent No.: US 6,721,219 B2
(45) Date of Patent: Apr. 13, 2004

(54) METHOD AND CIRCUIT ARRANGEMENT FOR READING OUT AND FOR STORING BINARY MEMORY CELL SIGNALS

(75) Inventors: Athanasia Chrysostomides, München (DE); Sabine Kling, München (DE); Peter Pfefferl, Höhenkirchen (DE); Dominique Savignac, Ismaning (DE); Helmut Schneider, München (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/150,340

(22) Filed: May 17, 2002

(65) Prior Publication Data

US 2003/0012061 A1 Jan. 16, 2003

(30) Foreign Application Priority Data

May 21, 2001 (DE) .......................... 101 24 753

(51) Int. Cl.[7] ................................. G11C 7/00
(52) U.S. Cl. ...................... 365/205; 365/202
(58) Field of Search .............................. 365/205, 196, 365/190, 202, 207

(56) References Cited

U.S. PATENT DOCUMENTS

| | | | |
|---|---|---|---|
| 5,995,432 A | | 11/1999 | Nagata et al. |
| 6,147,925 A | * | 11/2000 | Tomishima et al. ..... 365/230.03 |
| 6,519,195 B2 | * | 2/2003 | Kanno et al. ............... 365/203 |

* cited by examiner

Primary Examiner—Thong Q. Le
(74) Attorney, Agent, or Firm—Jenkins, Wilson & Taylor, P.A.

(57) ABSTRACT

The invention provides a method in which a binary memory cell signal from a; least one memory cell is applied to at least one bit line pair (201$t$, 201$b$), the binary memory cell signal from the memory tell is switched through via the bit line pair (201$t$, 201$b$) to at least one sense amplifier (202), a binary output signal of the sense amplifier (202) is switched through to a local data line pair (205) as a binary intermediate signal, the binary intermediate signal on the local data line pair (205) is switched through to at least one main data line pair (208) by means of a main data line switching transistor pair (209) in a manner dependent on a row control signal fed via a row control line (210), the main data line switching transistor pair (209) being arranged in the through-plating regions formed between the memory cell arrays.

9 Claims, 3 Drawing Sheets

METHOD AND CIRCUIT ARRANGEMENT FOR READING OUT AND FOR STORING BINARY MEMORY CELL SIGNALS

DESCRIPTION

1. Technical Field

The present invention relates to binary memories, and in particular relates to a method and a circuit arrangement for reading out binary memory cell signals from a memory cell array and for storing binary memory cell signals in a memory cell array.

2. Background Art

In digital memories (RAM, DRAM, SRAM), an information item stored digitally in the form of binary memory cell signals has to be transferred to an output terminal of the circuit arrangement (chip). Memory cells are conventionally arranged in memory cell arrays having a size of 512×128, for example. In this case: 512 word lines can be activated in order to load a binary information item into the respective memory cell array. In the circuit arrangement specified above, 128 bit line pairs serve for reading out the corresponding binary information or for transferring binary memory cell signals from the memory cell array and for storing binary memory cell signals in the memory cell array.

A bit line pair usually comprises two lines which have complementary binary signal states. On account of the usually highly complex circuit arrangement, the bit line pairs cannot be used for forwarding binary memory cell signals directly to externally accessible Output terminals. Besides a complex line structure, the binary memory cell signals additionally have to be regenerated or amplified in sense amplifiers or latches. In this case, it is necessary to arrange the sense amplifiers together with various switching transistor pairs in order that an information item present on bit line pairs is finally conducted away to an output terminal.

FIG. 1 shows a known circuit arrangement in which eight sense amplifiers S/A interact with a main data line switching transistor pair MDQS. The memory cell signals transferred from corresponding memory cell S arrays are present on respective bit line pairs designated by <0> to <7>, where BL designates a bit line pair, t designates a top memory cell array, b following the symbol BL designates a bottom memory cell array, and a preceding b designates a complementary line of the bit line pair (bar).

Memory cell signals which are present on the top bit lines t and originate from a cop memory cell array or binary memory cell signals which are present on the bottom bit line pairs b and originate from a bottom memory cell array can optionally be applied to the sense amplifiers S/A. In this case, a main data line switching transistor pair MDQS serves for switching binary memory cell signals which are present on local data line pairs to a main data line pair, at least one sense amplifier S/A being activated.

On account of possible interference and influencing of adjacent data lines, the lines of the bit line pairs must have a specified minimum distance which depends on the desired specifications for the memory cell array and technological fabrication processes.

FIG. 1 shows by way of example a fixed data line distance, it being discernible that bit line pairs arranged in the vicinity of the main data line switching transistor pair MDQS, here the bit line pairs designated with the index numbers 3 and 4, have bevels, which are disadvantageous for customary fabrication processes.

A further disadvantage of such bevels is that in principle usable area of the circuit arrangement, i.e. chip area, is wasted.

Yet another disadvantage of the bevels in bit data line pairs is that undesirable edge effects occur.

Furthermore, it is inexpedient that a regular wiring of the bit line pairs with the sense amplifiers is disturbed by a centrally arranged main data line switching transistor pair MDQS.

Furthermore, an arrangement of main data line switching transistor pairs according to FIG. 1 disadvantageously enlarges a mutual distance between the memory cell arrays, whereby a chip size is increased overall.

SUMMARY OF THE INVENTION

Consequently, it is an object of the present invention to provide a circuit arrangement in which main data line switching transistor pairs are arranged in such a way that bit line pairs can be designed regularly, and that, in particular, bevels in bit line pairs are avoided, whereby utilization of a chip area is improved.

This object is achieved according to the invention by means of a method according to claim 1 and also a circuit arrangement having the features of claim 4.

The heart of the invention consists in al least one main data line switching transistor pair being placed in through-plating regions which are arranged between individual memory cell arrays.

The invention's method for reading out binary memory cell signals from a memory cell array and for storing binary memory cell signals in a memory cell array has the following steps:

a) application of at least one binary memory cell signal from at least one memory cell arranged in a memory cell array to a bit line pair;

b) switching-through of a binary memory cell signal from the memory cell of a memory cell array via a bit line pair to at least one sense amplifier, at least one memory cell array switching transistor pair being used, in a manner dependent on at least one memory cell array control signal fed via at least one memory cell array control line;

c) switching-through of a binary output signal of the sense amplifier to a local data line pair as a binary intermediate signal by means of at least one local data line switching transistor pair in a manner dependent on a column control signal fed via a column control line;

d) switching-through of the binary intermediate signal of the local data line pair to at least one main data line pair by means of at least one main data line switching transistor pair in a manner dependent on a row control signal fed via a row control line; and e) outputing of a binary output signal via the main data line pair to an output terminal.

Advantageous developments and improvements of the respective subject matter of the invention can be found in the subclaims.

In accordance with one preferred development of the present invention, at least one main data line switching transistor pair, which provides a switching-through of binary memory cell signals from local data line pairs to main data line pairs, is provided in through-plating regions arranged between memory cell arrays, thereby producing a regular arrangement of bit line pairs across the memory cell array.

In accordance with a further preferred development of the present invention, the bit line pairs are provided rectilinearly with only minimal bevels, so that a chip area can be reduced.

The invention's circuit arrangement for reading out binary memory cell signals from a memory cell array arranged in a memory cell area and for storing binary memory cell signals in the memory cell array furthermore has:

a) at least one bit line pair for connecting at least one memory cell of a memory cell array to at least one memory cell array switching transistor pair;

b) at least one sense amplifier connected to the memory cell array switching transistor pair, said sense amplifier being arranged symmetrically with respect to the bit line pairs of memory cell areas whose memory cell arrays are connected to the sense amplifier;

c) at least one local data line switching transistor pair for switching the binary output signal of the sense amplifier to at least one local data line pair; and d) at least one main data line switching transistor pair for connecting the local data line pair to at least one main data line pair, at least one main data line switching transistor pair being arranged in through-plating regions between memory cell arrays.

BRIEF DESCRIPTION OF THE DRAWINGS

Exemplary embodiments of the invention are illustrated in the drawings and are explained in more detail in the description below.

In the drawings.

DETAILED DESCRIPTION OF THE INVENTION

Figure 2:
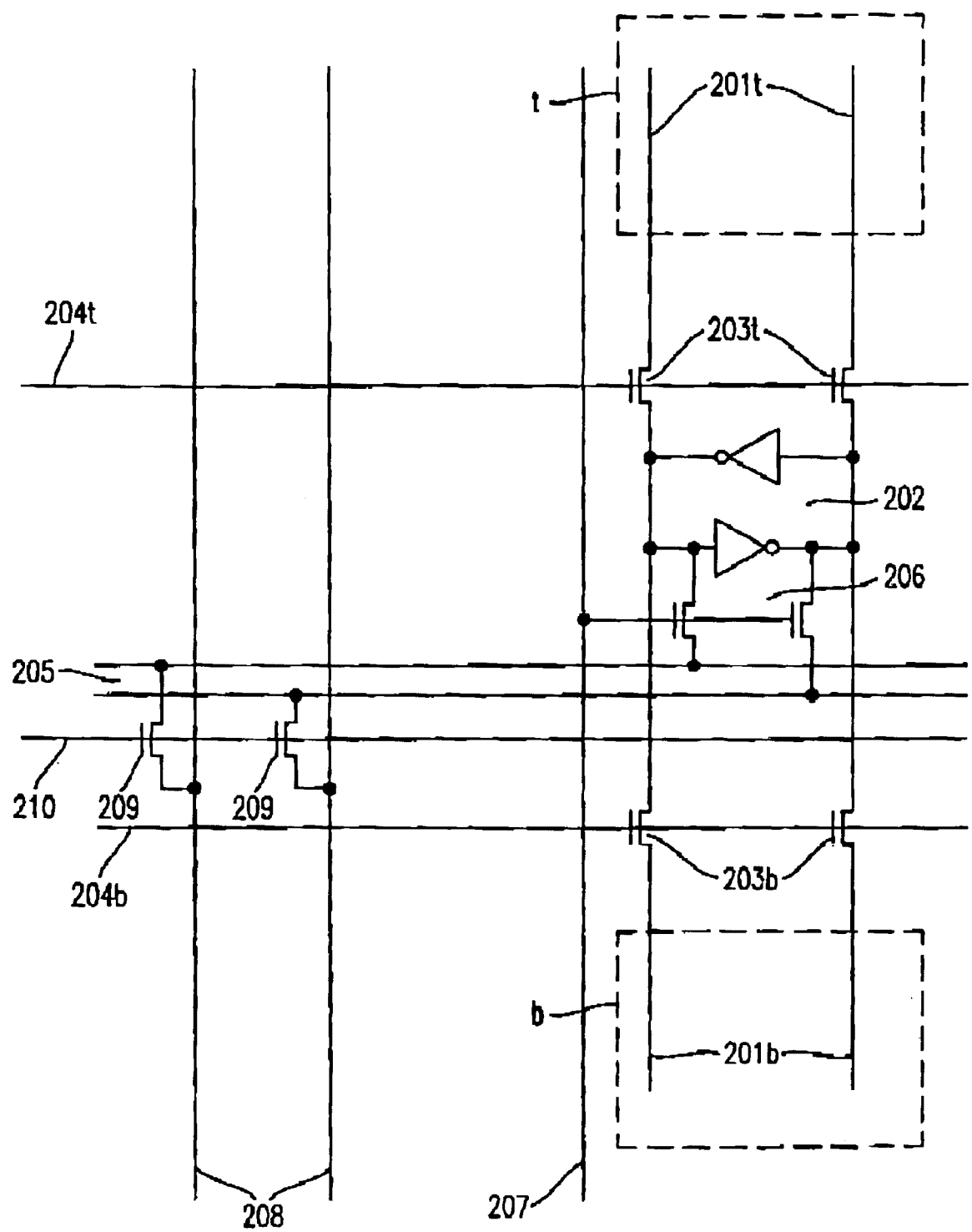
FIG. 2 shows a circuit arrangement which is provided for reading out binary memory cell signals from a memory cell array or for storing binary memory cell signals in the memory cell array in accordance with an exemplary embodiment of the present invention.

FIG. 2 illustrates a circuit arrangement which is provided for reading out binary memory cell signals from a memory cell array or for storing binary memory cell signals in a memory cell array in accordance with. an exemplary embodiment of the present Invention.

As shown in FIG. 2 the bit line pairs 201t and 201b are connected to memory cell array switching transistor pairs 203t and 203b, respectively. A memory cell array control signal, which is applied to a memory cell array control line 204t or 204b, determines whether a binary memory cell signal of a memory cell array t (top region in FIG. 2) or a binary memory cell signal from a memory cell array b (bottom region in FIG. 2) is transferred to a sense amplifier 202. The sense amplifier 202 is shown as a latch comprising two mutually oppositely switched inverters.

The sense amplifier 202 is switched into a defined binary state in accordance with the binary memory cell signal present on the respective bit line pair. By means of a column control signal applied to a column control line 207, a binary output signal of a sense amplifier 202, which is assigned to a memory cell column, is transferred to a local data line pair 205.

A main data line switching transistor pair 209 is activated in accordance with a row control signal via a row control line 210, and transfers o a main data line pair 209 the binary output signal of the sense amplifier 202 that has been transferred to the local data line pair 205.

While the local data line pair 205 only runs over regions of a few sense amplifiers 202 and is thus not able to pass the binary memory cell signal out to an output terminal, the main data line pairs 208 running parallel to the column control line 207 are suitable for passing the binary memory cell signals out to an output terminal.

Figure 1:
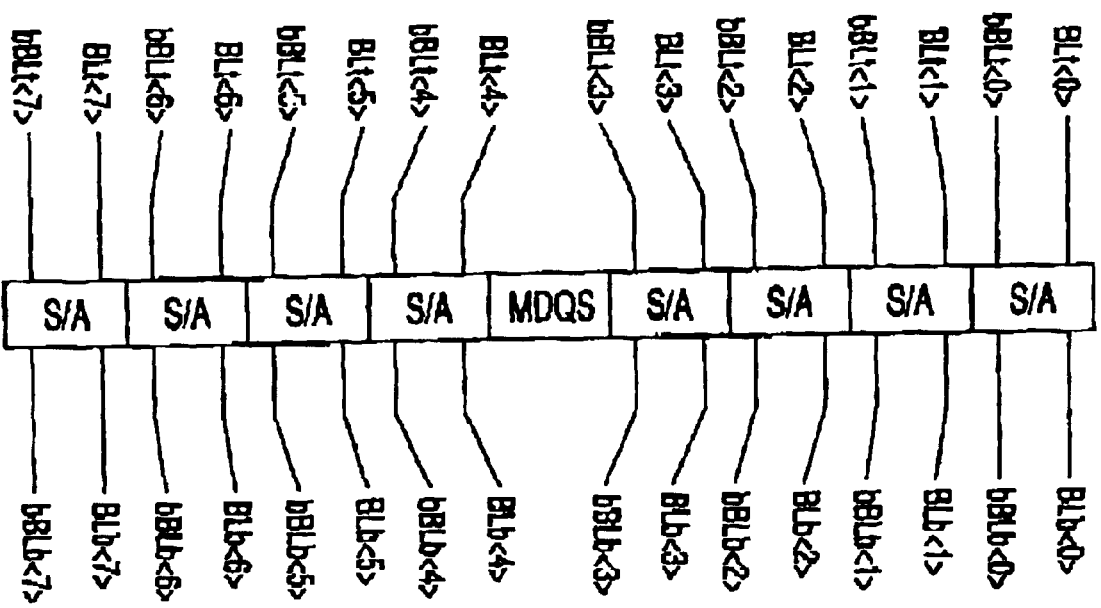
FIG. 1 shows a known circuit arrangement in which a main data line switching transistor pair arranged between two adjoining sense amplifiers serving for switching through binary memory cell signals to main data line pairs is shown.
Figure 3:
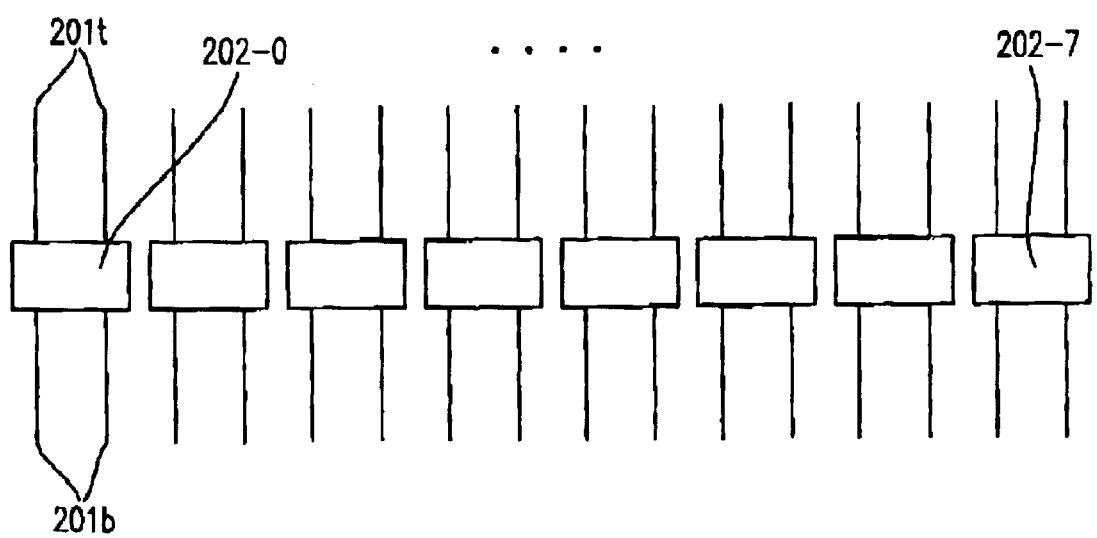
FIG. 3 shows a circuit arrangement with rectilinearly running bit line pairs with only minimal bevels in accordance with an exemplary embodiment of the present invention.

In the case of the circuit arrangement shown in FIG. 3, eight sense amplifiers 202-0 to 202-7 are arranged in accordance with the circuit arrangement shown in FIG. 1, the exemplary embodiment of the present invention now providing rectilinearly running bit line pairs 201t and 201b with only minimal bevels for connecting the respective memory cell array to the corresponding sense amplifier 202.

The main data line switching transistor pair 209, which is no longer present in FIG. 3 in comparison with FIG. 1, is arranged in the through-plating region arranged between the memory cell arrays and switches a binary intermediate signal of the respective local data line pair 205 to the main data line pair 208 in a manner dependent on a row control signal fed via the row control line 210.

In this case, the through-plating regions are regions in which no bit line pairs 201t and 201b are present, whereby a required chip area is reduced. A binary Intermediate signal on a local data line pair 205 is switched through by the main data line switching transistor pair 209 to at least one main data line pair 208, in which case a binary memory cell signal which is provided on a local data line pair 205 can be switched through to one or more main data line pairs 208.

The main data line switching transistor pair 209 arranged in the through-plating regions can thus receive a predeterminable number of output signals of sense amplifiers 202.

In the circuit arrangement in accordance with an exemplary embodiment of the present invention, said circuit arrangement also being shown with reference to FIG. 2, the bit line pairs 201t, 201b, the main data line pairs 208 and the column control Line 207 are arranged parallel to one another, and are arranged in such a way as to comply with a sufficient signal-to-noise ratio between the individual lines.

The local data line pairs 205, the memory cell array control lines 204, 204b and the row control lines 210 run parallel to one another and perpendicularly to the bit line pairs 201t, 201b, the main data line pairs 208 and the column control lines 207. In this case, the memory cell array control lines 204t, 204b and the row control lines 210 have a minimum distance from one another which is predetermined by a signal-co-noise ratio between the individual lines. A section of a local data line pair 205 extends over a length of, for example, four memory cell arrays, whereby the number of main data line pairs 208 is reduced. More precisely, when she length of a section of the local data lines is doubled from two memory cell arrays to four memory cell arrays, the number of main data line pairs 208 is halved.

With regard to the known circuit arrangement illustrated in FIG. 1, reference is made to the introduction to the description.

Although the present invention has been described above using preferred exemplary embodiments, it is not restricted thereto, but rather can be modified in various ways.

List of reference symbols

In the figures, identical reference symbols designate identical or functionally identical components.

201t, 201b bit line pair
202, 202-0 ... 202-7 sense amplifier memory cell array
203t, 203b switching transistor pair
204t, 204b memory cell array control line
205 local data line pair
206 local data line switching transistor pair
207 column control line
208 main data line pair
209 main data line switching transistor pair
210 row conrol line

What is claimed is:

1. Method for reading out binary memory cell signals from a memory cell array and for storing binary memory cell signals in a memory cell array, having the following steps:

a) application of at least one binary memory cell signal from a plurality of memory cells to a plurality of bit line pairs, wherein the bit line pairs are arranged to run rectilinearly and to have minimal bevels;

b) switching-through of the binary memory cell signals from the memory cells via the bit line pairs a plurality of sense amplifiers by means of at least one memory cell array switching transistor pair in a manner dependent on at least one memory cell array control signal fed via at least one memory cell array control;

c) switching-through of a binary output signals of the sense amplifiers to a local data line pair as a binary intermediate signal by means of at least one local data line switching transistor pair in a manner dependent on a column control signal fed via a column control line;

d) switching-through of the binary intermediate signal of the local data line pair to at least one main data line pair by means of at least one main data line switching transistor pair in a manner dependent on a row control signal fed via a row control line; and e) outputing of a binary output signal via the main data line pair.

2. Method for reading out and for storing binary memory cell signals according to claim 1, wherein at least one main data line switching transistor pair is provided in through-plating regions which are arranged between memory cell arrays.

3. Method for reading out and for storing binary memory cell signals according to claim 1, wherein at least one memory line pair is provided with minimal bevels.

4. Circuit arrangement for reading out binary memory cell signals from a memory cell array and for storing binary memory cell signals in a memory cell array, having:

a) a plurality of bit line pairs for connecting a plurality of memory cells of a memory cell array to at least one memory cell array switching transistor pair, wherein the bit line pairs are arranged to run rectilinearly and to have minimal bevels;

b) a plurality of sense amplifiers connected to the memory cell array switching transistor pair, said sense amplifiers being arranged symmetrically with respect to the bit line pairs;

c) at least one local data line switching transistor pair for switching the binary output signals of the sense amplifiers to at least one local data line pair; and d) at least one main data line switching transistor pair for connecting the local data line pair to at least one main data line pair arranged in through-plating regions.

5. Circuit arrangement for reading out and for storing binary memory cell signals according to claim 4, wherein the main data line switching transistor pair switches through a binary intermediate signal on a local data line pair to at least one main data line pair.

6. Circuit arrangement for reading out and for storing binary memory cell signals according to claim 4, wherein the main data line switching transistor pair is arranged in the through-plating regions.

7. Circuit arrangement for reading out and for storing binary memory cell signals according to claim 4, wherein the bit line pairs, the main data line pairs and the column control lines run parallel to one another and have a minimum distance from one another corresponding to a signal-to-noise ratio between the individual lines.

8. Circuit arrangement for reading out and for storing binary memory cell signals according to claim 4, wherein the local data line pairs, the memory cell array control lines and the row control lines run parallel to one another and perpendicularly to the bit line pairs, the main data line pairs and the column control lines and have a minimum distance from one another corresponding to a signal-to-noise ratio between the individual lines.

9. Circuit arrangement for reading out and for storing binary memory cell signals according to claim 4, wherein a section of at least one local data line pair extends over a length of at least one memory cell array.

* * * * *